United States Patent [19]

Sakuma et al.

[11] Patent Number: 5,498,561
[45] Date of Patent: Mar. 12, 1996

[54] METHOD OF FABRICATING MEMORY CELL FOR SEMICONDUCTOR INTEGRATED CIRCUIT

[75] Inventors: Toshiyuki Sakuma; Yoichi Miyasaka, both of Tokyo, Japan

[73] Assignee: NEC Corporation, Tokyo, Japan

[21] Appl. No.: 914,023

[22] Filed: Jul. 15, 1992

Related U.S. Application Data

[63] Continuation of Ser. No. 798,895, Nov. 27, 1991, abandoned.

[30] Foreign Application Priority Data

Nov. 30, 1990 [JP] Japan .................. 2-329690

[51] Int. Cl.⁶ ........................................ H01L 21/8242
[52] U.S. Cl. ................ 437/52; 437/60; 437/919; 216/6; 216/22
[58] Field of Search .................... 437/47, 48, 52, 437/228, 60, 919, 977; 216/6, 22

[56] References Cited

U.S. PATENT DOCUMENTS

| | | | |
|---|---|---|---|
| 4,937,649 | 6/1990 | Shiba et al. | 357/51 |
| 4,971,924 | 11/1990 | Tigelaar et al. | 457/60 |
| 4,981,812 | 1/1991 | Nishizaka | 437/52 |
| 5,012,309 | 4/1991 | Nakayama | 357/23.6 |
| 5,014,098 | 5/1991 | Schlais et al. | 357/23.5 |
| 5,057,447 | 10/1991 | Paterson | 437/43 |
| 5,109,357 | 4/1992 | Eaton, Jr. | 365/145 |
| 5,130,267 | 7/1992 | Kaya et al. | 437/47 |
| 5,162,931 | 11/1992 | Holmberg | 359/54 |
| 5,219,781 | 6/1993 | Yoreda | 437/52 |
| 5,273,927 | 12/1993 | Gnadinger | 437/919 |
| 5,332,684 | 7/1994 | Yamamichi et al. | 437/52 |

FOREIGN PATENT DOCUMENTS

| | | | |
|---|---|---|---|
| 1-022057 | 1/1989 | Japan | 437/919 |
| 1-82557 | 3/1989 | Japan | 437/919 |

OTHER PUBLICATIONS

Wolf, "Silicon Processing for the VLSI Era, vol. II" pp. 121-131, 195. 222-224, 599, 613-615, 1990.

Yamada, Keisaku, "Thermodynamical Approach to a New High Dielectric Capacitor Structure: W/HfO₂/W," Aug. 20-22, 1986, Tokyo Japan, *Japanese Journal of Applied Physics; Supplements,* pp. 257-260.

T. Ema et al., "3-Dimensional Stacked Capacitor Cell For 16M and 64M Drams", CH2528-8/88/0000-0592, 1988 IEEE, pp. 592-595.

*Primary Examiner*—George Forson
*Assistant Examiner*—Richard A. Booth
*Attorney, Agent, or Firm*—Sughrue, Mion, Zinn, Macpeak & Seas

[57] ABSTRACT

According to a method of fabricating a memory cell for a semiconductor integrated circuit, a lower electrode having a predetermined shape is formed on a semiconductor layer. A first insulating interlayer is formed on an entire surface of the semiconductor layer such that only a top surface of the lower electrode is exposed. A dielectric having a high dielectric constant is formed on the lower electrode and on the semiconductor layer. An upper electrode is formed on the dielectric having a high dielectric constant. The upper electrode constitutes a capacitor with the lower electrode through the dielectric.

13 Claims, 3 Drawing Sheets

5,498,561

METHOD OF FABRICATING MEMORY CELL FOR SEMICONDUCTOR INTEGRATED CIRCUIT

This is a continuation of application Ser. No. 07/798,895, filed Nov. 27, 1991 now abandoned.

BACKGROUND OF THE INVENTION

The present invention relates to a method of fabricating a dynamic random access memory for a semiconductor integrated circuit and, more particularly, to a method of fabricating a capacitor of a memory cell having a structure in which the capacitor is formed after a bit line is formed.

Conventionally, a memory cell of this type is constituted by a single MOS transistor and a capacitor having a stacked structure which is composed of a silicon oxide film and a silicon nitride film and has polysilicon as an electrode. A technique for forming this capacitor after formation of a bit line is described in, e g., "International Electron Devices Meeting Digest of Technical Papers," 1988, PP. 592–595. In this technique, after polysilicon serving as a lower electrode is formed, formation of a silicon dioxide film and a silicon nitride film is performed by a thermal oxidation method and a CVD (Chemical Vapor Deposition) method, respectively. Thereafter, polysilicon serving as an upper electrode is stacked, thus completing the capacitor.

In order for the above conventional memory cell to meet higher degrees of integration of recent integrated circuits, however, a reduction in the area of the capacitor must be compensated by decreasing the film thickness of a dielectric film and by effectively increasing the area by means of a three-dimensional structure, in which the capacitor is formed using the upper and side surfaces of the lower electrode. Since the dielectric film for forming the conventional capacitor consists of a silicon oxide film and a silicon nitride film, its dielectric constant is at most 7. Therefore, an extremely small film thickness (silicon oxide film) of 10 nm or less is necessary to realize the capacitor required. However, it is very difficult to form a dielectric thin film layer having a current-voltage characteristic lower than a permitted leakage current. In addition, in the method in which the electrode area is effectively increased by the three-dimensional structure, a leakage current is increased because the film thickness of a silicon oxide film is decreased or electric fields are concentrated at the end of the lower electrode. Furthermore, since the physical size of steps is increased by the three-dimensional structure, it becomes more difficult to form wiring without disconnections after the formation of the capacitor. This results in a reduction in yield.

SUMMARY OF THE INVENTION

It is a principal object of the present invention to provide a method of fabricating a memory cell for a semiconductor integrated circuit, which can realize a higher degree of integration by decreasing the film thickness of a dielectric film in a capacitor.

It is another object of the present invention to provide a method of fabricating a memory cell for a semiconductor integrated circuit, which can realize a dielectric thin film layer having a current-voltage characteristic lower than a predetermined leakage current.

It is still another object of the present invention to provide a method of fabricating a memory cell for a semiconductor integrated circuit, which can realize a flat structure without decreasing the film thickness of a dielectric at the end of a lower electrode.

It is still another object of the present invention to provide a method of fabricating a memory cell for a semiconductor integrated circuit, which can prevent a reduction in yield due to disconnections in wiring formed after a capacitor.

In order to achieve the above objects of the present invention, there is provided a method of fabricating a memory cell for a semiconductor integrated circuit, comprising the steps of forming a lower electrode having a predetermined shape on a semiconductor layer, forming a first insulating interlayer on an entire surface of the semiconductor layer such that only a top surface of the lower electrode is exposed, forming a dielectric having a high dielectric constant on the lower electrode and on the semiconductor layer, and forming an upper electrode on the dielectric having a high dielectric constant, the upper electrode constituting a capacitor with the lower electrode through the dielectric.

DETAILED DESCRIPTION OF THE PREFERRED EMBODIMENTS

Figure 1A:
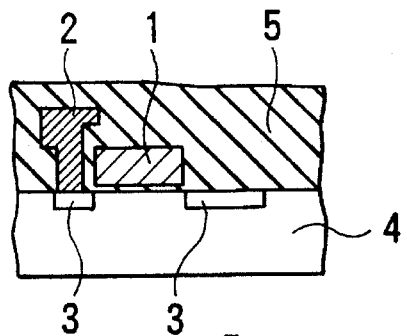
FIGS. 1A to 1E are sectional views showing the steps in fabrication according to the first embodiment of the present invention.

Embodiments of the present invention will be described below with reference to the accompanying drawings.

Embodiment 1

FIGS. 1A to 1E show the steps in fabrication according to the first embodiment of the present invention. In this embodiment, after a bit line is formed, polysilicon, one or more types of barrier metals, a dielectric, and an upper electrode are stacked in sequence to fabricate a capacitor. In this case, after materials up to the barrier metal are formed as a lower electrode, an insulating interlayer is formed such that the top surface of the lower electrode is exposed. Thereafter, the dielectric having a high dielectric constant and the upper electrode are stacked sequentially to fabricate the capacitor. Referring to FIG. 1, reference numeral 1 denotes a word line corresponding to the gate of a transistor made of polysilicon; 2, a bit line of a memory cell; 3, diffusion layers corresponding to the source and the drain of the transistor; 4, a silicon substrate; 5, an insulating interlayer; 6, polysilicon serving as the lower electrode of the capacitor; 7, a barrier metal; 8, an insulating interlayer; 9, a photoresist; 10, strontium titanate; and 11, an upper electrode.

Figure 1B:
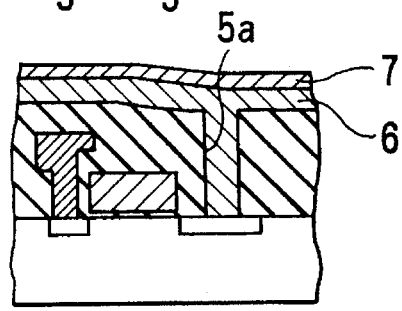
Figure 1C:
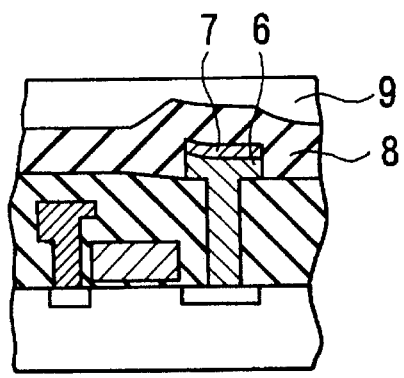
Figure 1D:
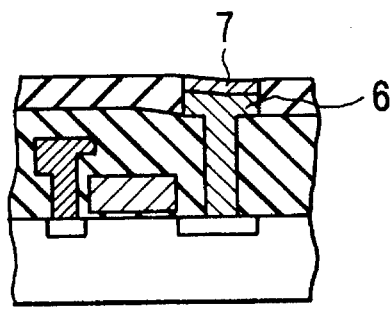
Figure 1E:
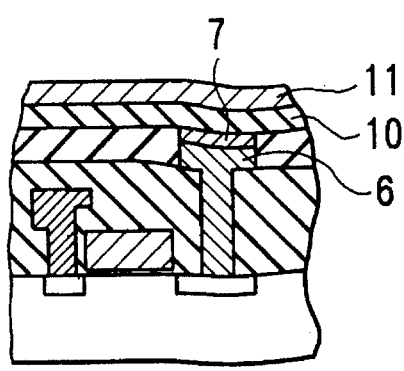

FIG. 1A shows a section obtained after a transistor portion of the memory cell is formed in a semiconductor layer composed of the silicon substrate 4 and the insulating interlayer 5. Next, as shown in FIG. 1B, in order to form a lower electrode of the capacitor, a contact hole 5a reaching the diffusion layer is formed in the insulating interlayer 5 by well-known photolithography and plasma etching. Thereafter, the polysilicon 6 is formed by an LPCVD method, and phosphorus i diffused to decrease the resistance at that location to 13 to 100Ω/□. Tantalum and platinum are stacked in sequence to have a thickness of 10 to 100 nm each, thus forming the barrier metal 7. Subsequently, as shown in FIG. 1C, the barrier metal 7 and the polysilicon 6 are formed into a predetermined shape as a lower electrode by photolithography and plasma etching. After the insulating interlayer is stacked, the photoresist 9 is coated. Thereafter, as shown in FIG. 1D, by means of plasma etching mainly using CF4 gas in which the photoresist 9 and the insulating interlayer 8 are etched away at an equal etching rate, etching is performed until the surface of the barrier metal 7 is exposed to the same level as the insulating interlayer 8. Subsequently, as shown in FIG. 1E, the strontium titanate film 10 is stacked as a dielectric having a high dielectric constant to have a thickness of 50 to 200 nm by a radio-frequency sputtering method, and polysilicon is formed as the upper electrode 11 by the LPCVD method.

Embodiment 2

FIGS. 2A to 2E show the steps in fabrication according to the second embodiment of the present invention. In the second embodiment, after a bit line is formed, polysilicon, one or more types of barrier metals, a dielectric, and an upper electrode are stacked in sequence to fabricate a capacitor. In this case, after materials up to the barrier metal are formed as a lower electrode, an insulating interlayer is formed only on side surfaces of the electrode. Thereafter, the dielectric having a high dielectric constant and the upper electrode are formed sequentially, thus fabricating the capacitor. Referring to FIGS. 2A to 2E, reference numeral 101 denotes a word line; 102, a bit line; 103, diffusion layers corresponding to the source and the drain of a transistor; 104, a silicon substrate; 105, an insulating interlayer; 106, polysilicon serving as a lower electrode of the capacitor; 107, a barrier metal; 108, an insulating interlayer; 109, strontium titanate; and 110, an upper electrode.

Figure 2A:
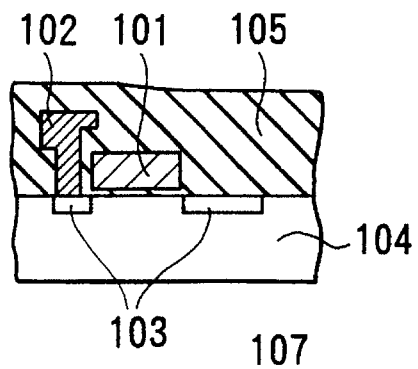
FIGS. 2A to 2E are sectional views showing the steps in fabrication according to the second embodiment of the present invention.
Figure 2B:
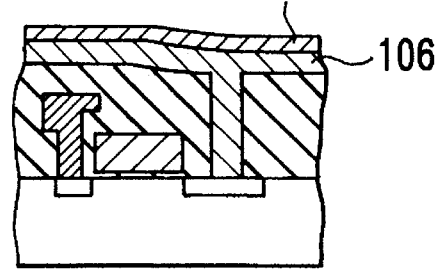
Figure 2C:
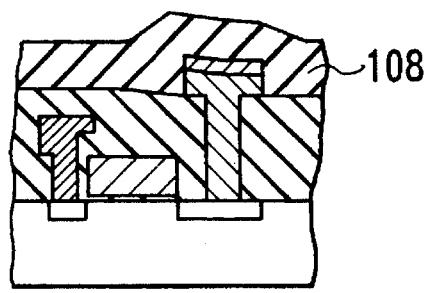
Figure 2D:
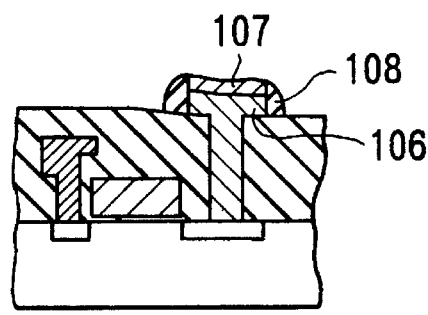
Figure 2E:
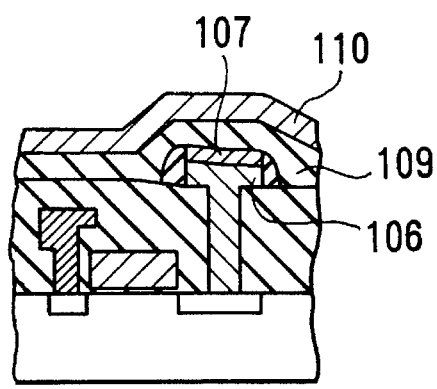

The process of fabrication is identical to the first embodiment until stacking of the insulating interlayer shown in FIG. 2C. After the insulating interlayer 108 is stacked, as shown in FIG. 2D, etching is performed on the entire surface by means of plasma etching using $CF_4$ gas as its main component, thereby leaving the insulating interlayer 108 only on side surface of the polysilicon 106 constituting the lower electrode and of the barrier metal 107. Subsequently, as shown in FIG. 2E, after the strontium titanium film 109 is stacked as a dielectric having a high dielectric constant to have a thickness of 50 to 200 nm by a radio-frequency sputtering method, polysilicon is formed as the upper electrode 110 by an LPCVD (Low Pressure Chemical Vapor Deposition) method, thus fabricating the capacitor.

The second embodiment has an advantage over the first embodiment, in that a coating film such as a photoresist need not be coated in the etching back of the insulating interlayer.

Embodiment 3

FIGS. 3A to 3E show the steps in fabrication according to the third embodiment of the present invention. In the third embodiment, after a bit line is formed, polysilicon, one or more types of barrier metals, a dielectric, and an upper electrode are stacked in sequence to fabricate a capacitor. In this case, after materials up to the barrier metal are formed into a predetermined shape as a lower electrode, the dielectric having a high dielectric constant is stacked to temporarily have a large thickness. Thereafter, etching back is performed by means of wet etching such that a predetermined thickness is obtained on the lower electrode, and the upper electrode is stacked on the resulting structure, thus fabricating the capacitor. Referring to FIGS. 3A to 3E, reference numeral 201 denotes a word line; 202, a bit line; 203, diffusion layers corresponding to the source and the drain of a transistor; 204, a silicon substrate; 205, an insulating interlayer; 206, polysilicon serving as a lower electrode of the capacitor; 207, a barrier metal; 208, strontium titanium; and 209, an upper electrode.

Figure 3A:
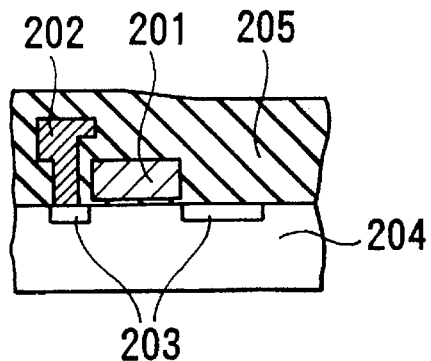
FIGS. 3A to 3E are sectional views showing the steps in fabrication according to the third embodiment of the present invention.
Figure 3B:
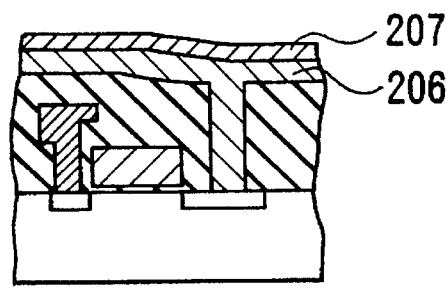
Figure 3C:
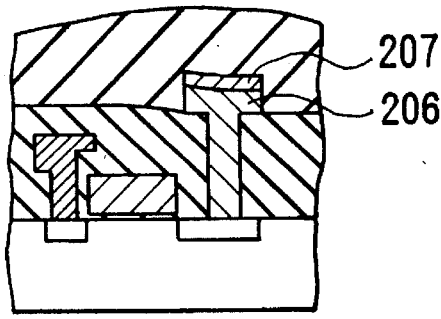
Figure 3D:
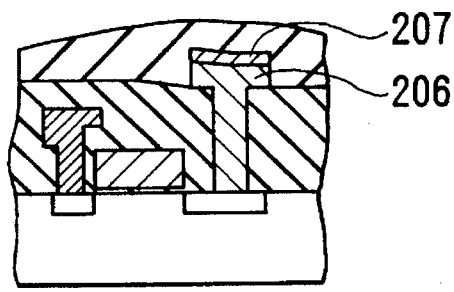
Figure 3E:
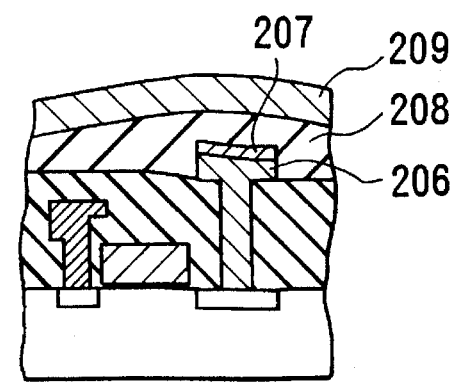

The process of fabrication is the same as in the first and second embodiments until the formation of the barrier metal and the lower electrode shown in FIG. 3C. Referring to the sectional view of FIG. 3C, after the formation of the barrier metal 207 and the polysilicon 206 as the lower electrode, the strontium titanate film 208 as a dielectric having a high dielectric constant for an insulating interlayer is stacked to have a large thickness by a radio-frequency sputtering method. FIG. 3D shows a section obtained from the section shown in FIG. 3C by etching the entire surface by means of wet etching or plasma etching such that a thickness of 50 to 200 nm is obtained on the barrier metal 207. Referring to FIG. 3E, polysilicon as the upper electrode 209 is further stacked by an LPCVD method, thereby fabricating the capacitor.

The third embodiment has an advantage, compared with the first and second embodiments, that no insulating interlayer need be stacked or processed before stacking of a dielectric.

According to the fabricating method of the present invention as has been described above, in order to obtain a structure using only the top surface of a lower electrode, side surfaces of the lower electrode are covered with an insulating interlayer, and then a dielectric having a high dielectric constant and an upper electrode is formed. Alternatively, after a dielectric is stacked to temporarily have a large thickness, etching back is performed to form a dielectric layer. Therefore, a flat structure can be realized without decreasing the film thickness of the dielectric at the edge of the lower electrode. In addition, a small leakage current makes it possible to realize a capacitor having a high capacitor density.

What is claimed is:

1. A method of fabricating a capacitor of a memory cell, including an MOS transistor and the capacitor, for a semiconductor integrated circuit, comprising the steps of:

forming a lower electrode on an insulating layer;

forming a first insulating interlayer on the entire surface of said insulating layer and said lower electrode;

forming a photoresist on the entire surface of said first insulating interlayer;

etching said photoresist and said first insulating interlayer such that only the top surface of said lower electrode is exposed;

forming a strontium titanium dielectric on said lower electrode and on said first insulating interlayer; and forming an upper electrode on said dielectric, said upper electrode constituting the capacitor with said lower electrode through said dielectric.

2. A method according to claim 1, wherein said lower electrode consists of polysilicon on top of which a barrier metal is stacked, and said first insulating interlayer has an upper surface which is even with that of said barrier metal.

3. A method according to claim 1, wherein the MOS transistor has diffusion regions corresponding to a source and a drain, has a gate arranged between said diffusion regions via an insulation film, and is formed on a semiconductor substrate.

4. A method according to claim 3, wherein said insulating layer is formed on said semiconductor substrate to cover said gate, and said lower electrode is formed on said insulating layer and connected to said diffusion regions of said semiconductor substrate.

5. A method according to claim 3, wherein a bit line of said memory cell is formed on a surface of said semiconductor substrate so as to be in contact with said diffusion layers, and said gate constitutes a word line.

6. A method of fabricating a capacitor of a memory cell, including an MOS transistor and the capacitor, for a semiconductor integrated circuit, comprising the steps of:

forming a lower electrode on an insulating layer;

forming a first insulating interlayer on only side surfaces of said lower electrode as sidewall spaces;

forming a strontium titanate dielectric on said lower electrode and said insulating layer; and forming an upper electrode on said dielectric, said upper electrode constituting the capacitor with said lower electrode through said dielectric.

7. A method according to claim 6, wherein the MOS transistor has diffusion regions corresponding to a source and a drain, has a gate arranged between said diffusion regions via an insulating film, and is formed on a semiconductor substrate.

8. A method according to claim 7, wherein said insulating layer is formed on said semiconductor substrate to cover said gate, and said lower electrode is formed on said insulating layer and connected to said diffusion regions on said semiconductor substrate.

9. A method according to claim 7, wherein a bit line of said memory cell is formed on a surface of said semiconductor substrate so as to be in contact with said diffusion regions, and said gate constitutes a word line.

10. A method of fabricating a capacitor of a memory cell, including an MOS transistor and the capacitor, for a semiconductor integrated circuit, comprising the steps of:

forming a lower electrode on an insulating layer;

forming a strontium titanate dielectric film on said lower electrode, and etching said film back to a thickness by wet etching; and forming an upper electrode directly on said dielectric film without any intervening insulating layer, said upper electrode constituting the capacitor with said lower electrode through said dielectric.

11. A method according to claim 10, wherein the MOS transistor has diffusion regions corresponding to a source and a drain, has a gate arranged between said diffusion regions via an insulating film, and is formed on a semiconductor substrate.

12. A method according to claim 11, wherein said insulating layer is formed on said semiconductor substrate to cover said gate, and said lower electrode is formed on said insulating layer and connected to said diffusion regions on said semiconductor substrate.

13. A method according to claim 11, wherein a bit line of said memory cell is formed on a surface of said semiconductor substrate so as to be in contact with said diffusion regions, and said gate constitutes a word line.

\* \* \* \* \*